United States Patent
Hayworth et al.

(10) Patent No.: US 6,515,842 B1
(45) Date of Patent: Feb. 4, 2003

(54) MULTIPLE ARRAY AND METHOD OF MAKING A MULTIPLE ARRAY

(75) Inventors: Wilson Hayworth, Raleigh, NC (US); Sriram Dattaguru, Surfside Beach, SC (US)

(73) Assignee: AVX Corporation, Myrtle Beach, SC (US)

(*) Notice: Subject to any disclaimer, the term of this patent is extended or adjusted under 35 U.S.C. 154(b) by 0 days.

(21) Appl. No.: 09/538,465

(22) Filed: Mar. 30, 2000

(51) Int. Cl.[7] .................. H01G 4/005; H01G 4/228; H01G 4/06
(52) U.S. Cl. .............. 361/303; 361/306.1; 361/313
(58) Field of Search .................. 361/301.1, 301.2, 361/301.3, 301.4, 303, 306.1, 306.3, 308.1, 309, 311, 312, 313, 320, 321.1–321.5, 328, 329

(56) References Cited

U.S. PATENT DOCUMENTS

| | | | |
|---|---|---|---|
| 4,513,167 A | | 4/1985 | Brandstetter |
| 4,554,622 A | | 11/1985 | Mommsen et al. |
| 4,822,550 A | * | 4/1989 | Komathu .................. 264/263 |
| 4,853,827 A | * | 8/1989 | Hernandez ................ 361/321 |
| 4,870,541 A | | 9/1989 | Cole |
| 4,881,149 A | | 11/1989 | Tokura et al. |
| 4,988,850 A | | 1/1991 | Masuda et al. |
| 5,023,578 A | | 6/1991 | Kaneko et al. |
| 5,069,641 A | | 12/1991 | Sakamoto et al. |
| 5,142,439 A | * | 8/1992 | Huggett et al. ............ 361/321 |
| 5,153,554 A | | 10/1992 | Becker et al. |
| 5,282,759 A | | 2/1994 | Sakamoto et al. |
| 5,295,289 A | | 3/1994 | Inagaki et al. |
| 5,331,505 A | | 7/1994 | Wilheim |
| 5,334,968 A | | 8/1994 | Negoro |
| 5,360,353 A | | 11/1994 | Kinoshita |
| 5,367,430 A | | 11/1994 | DeVoe et al. |
| 5,461,536 A | | 10/1995 | Beach et al. |
| 5,493,471 A | | 2/1996 | Walther et al. |
| 5,495,386 A | | 2/1996 | Kulkarni |
| 5,495,387 A | | 2/1996 | Mandai et al. |

(List continued on next page.)

FOREIGN PATENT DOCUMENTS

EP 0915488 12/1999

*Primary Examiner*—Dean A. Reichard
*Assistant Examiner*—Eric W. Thomas
(74) *Attorney, Agent, or Firm*—Dority & Manning, P.A.

(57) ABSTRACT

A capacitor array device is described including a multiple capacitor chip for mounting upon an electronic circuit board. The device includes a device body defined by a plurality of dielectric layers and conductive layers arranged in a stack to form a number of adjacent capacitors. Barium titanate may be employed as a dielectric. The capacitor array device includes a plurality of terminal structures electrically connected to the electrode plates. The device typically includes a sintered body of a multilayer ceramic material in which multiple electrode layers are stacked with dielectric layers being located between the electrode layers. Multiple combinations of capacitance values may be used within the array. An array having two, three, four, five, six, or more capacitors may be constructed, such that certain of the capacitors have about the same capacitance value, while other capacitors within the array have other different capacitance values. The capacitance values among the adjacent capacitors within the array may differ by ratios as high as 1:100 or more.

44 Claims, 8 Drawing Sheets

U.S. PATENT DOCUMENTS

| | | |
|---|---|---|
| 5,527,443 A | 6/1996 | Chan |
| 5,548,474 A | 8/1996 | Chen et al. |
| 5,583,738 A | 12/1996 | Kohno et al. |
| 5,589,707 A | 12/1996 | Cronin |
| 5,590,016 A | 12/1996 | Fujishiro et al. |
| 5,729,438 A * | 3/1998 | Pieper et al. .................. 174/51 |
| 5,798,737 A | 8/1998 | Kanaba et al. |
| 5,853,805 A | 12/1998 | Mizuguchi et al. |
| 5,880,925 A | 3/1999 | DuPré et al. |
| 5,889,445 A | 3/1999 | Ritter et al. |
| 5,999,398 A | 12/1999 | Makl et al. |
| 6,016,019 A | 1/2000 | Wojewoda |
| 6,144,547 A | 11/2000 | Retseptor |
| 6,324,048 B1 | 11/2001 | Liu |

\* cited by examiner

|  C1  |  C2  |  C3  |  C4  |  C5  |  C6  |
|------|------|------|------|------|------|

FIG. 9.

|  C1  |  C2  |  C3  |  C4  |  C5  |  C6  |
|------|------|------|------|------|------|

FIG. 10.

MULTIPLE ARRAY AND METHOD OF MAKING A MULTIPLE ARRAY

BACKGROUND OF THE INVENTION

The present invention relates generally to multi-layer capacitor arrays, and methods of manufacturing such arrays. In particular, the invention relates to capacitor arrays in which a plurality of capacitor units are arranged in high density for maximum efficiency while occupying a minimum amount of space on the surface of a circuit board.

High density mounting of electronic components on circuit boards is common in the electronics industry. Miniature ceramic capacitors having multiple layers have been used for some time in electronic devices such as cellular telephones, network routers, computers, and the like. The manufacturing techniques of such devices must be precise to provide for the greatly reduced size of these devices, while still affording desirable electrical operating characteristics.

Several United States patents are directed to various aspects of electronic component manufacture. For example, U.S. Pat. No. 5,548,474 is directed to methods of manufacture of capacitors. The following patents also relate to such electronic components and methods of manufacture: U.S. Pat. Nos. 5,565,838; 3,117,365; 3,538,571; 3,617,834; 3,635,759; and 4,574,438. U.S. Pat. No. 5,880,925 is directed to a multilayer ceramic device suitable for use in surface mount decoupling applications which may utilize a single capacitor or a capacitor array. The above referenced patents are hereby incorporated by reference into this disclosure as if fully set forth herein.

For some time, the design of various electronic components has been driven by a general industry trend toward miniaturization. In this regard, a need exists for smaller electronic components having exceptional operating characteristics. For example, some applications require a large capacitance value, but are severely limited in the amount of space (known as "real estate") such a capacitor may occupy on a circuit board.

Multi-layer ceramic devices, sometimes referred to as "multi-layer ceramic capacitors" or "MLCC's" usually are constructed with a plurality of ceramic-electrode layers arranged in a stack. During manufacture, the layers are pressed and formed into a vertically stacked structure. MLCC's may have a single capacitor on a chip, or may include several capacitors in an array.

With the desire to increase functionality and reduce the size of such components, manufacturers are looking for new ways to provide varying (i.e. multiple) capacitance values in microcircuits. However, as the size of capacitors decreases, the dead space or spacing that must exist between capacitors when mounted on a circuit board becomes more and more important as a limiting factor in miniaturizing a design.

Thus, such capacitors typically have one pre-set capacitance value that cannot later be altered. Modernly, manufacturers are seeking ways to reduce the size and increase the flexibility of capacitor arrays. An array is a unit comprised of multiple capacitors. A significant limitation of current designs is that many currently known arrayed capacitors, once installed and constructed in the chip, are not variable as to their value (i.e.: the degree to which they can hold a charge).

A capacitor array having capacitors of varying value within a single chip would be highly desirable. Thus, a capacitor array design providing board manufacturers and assemblers more flexibility by affording multiple capacitance values on a single chip would be desirable. Further, an array design that can achieve these objectives while also conserving space on a circuit board would be highly desirable.

SUMMARY OF THE INVENTION

The present invention recognizes various disadvantages of prior art constructions and methods. Accordingly, it is one purpose of the present invention to provide various novel arrangements for the structure of a capacitor device.

It is a further object of the present invention to provide novel structural arrangements for a multi-layer ceramic capacitor array.

It is a further object of the present invention to provide a multi-layer ceramic capacitor having dual value arrays in which the array is formed using a process in which some of the capacitors in the array are formed on a first screen head, while other capacitors in the array are formed on a separate screen head. The construction of a capacitor in this way provides an opportunity to have multiple capacitance values within the same capacitor array.

Some of these objects are achieved by a capacitor device comprising a device body defined by a plurality of first layers and a plurality of second layers arranged in a stack. The layers are constructed of a capacitor material, such as a barium titanate. The capacitor device further includes a plurality of terminal structures electrically connected to the electrode plates in a predetermined manner.

The invention provides for a novel internal construction to achieve different capacitance values within the various elements of the chip. As one example, the device may integrate two or more different capacitance values into one standard capacitor array. A multitude of combinations are possible, including various combinations of the number of capacitors within the array, and also the value of each capacitor in farads or microfarads. The geographic location of a given capacitance value in a given array may be predetermined and selected to comply with a given manufacturing need on the surface of a circuit board. Thus, using this invention it is possible to custom manufacture capacitors for a given need on a given circuit board design, resulting in exactly the capacitance values needed, in exactly the order or location in which they are needed, while using a minimum amount of board space while doing so.

In the invention, an array is provided, comprising a first capacitor, the first capacitor having a first set of capacitor plates. Further, the first capacitor is usually capable of storing a predetermined electrical charge having a first value. Also provided is a second capacitor, the second capacitor comprising a second set of capacitor plates and also capable of storing a predetermined electrical charge having a second value. The second value may be about the same as the first value, or may be many orders of magnitude different from the first value. In many embodiments, the first value and the second value will be quite different. The capacitor array also may include capacitor plates of the first capacitor and the capacitor plates of the second capacitor which are formed by combining alternating layers of dielectric and conductive materials.

In some embodiments, the capacitor array may comprise a third capacitor having a third set of capacitor plates, the third capacitor being capable of storing a predetermined electrical charge having a third value. Still another alternative embodiment utilizes a fourth capacitor, the fourth capacitor comprising a fourth set of capacitor plates, the fourth capacitor being capable of storing a predetermined electrical charge having a fourth value. There is no practical limit to the number of capacitors that may be provided in the array of this invention. Arrays having five, six, seven, eight, or more capacitors may be employed, depending upon the circuit board application.

Although virtually any useful ordering or arrangement of capacitors may be employed, one common arrangement of a capacitor array having four capacitors is as follows: the two "outer" capacitors on the end of the array are of about the same value, while the two "inner" capacitors are of another distinct and separate value. In this particular embodiment, therefore, there is a "dual" or two value capacitor array in which two distinct capacitance values are provided on the chip (two capacitors per value in this instance). Of course, a multitude of other combinations are possible, especially as the number of capacitors on the chip increases. In some embodiments, an array is provided which has a first capacitance value and a second capacitance value that differ from each other by at least a factor of 10. In other embodiments, the capacitance values within a single array may differ by a factor of 100 or more.

In one embodiment of the invention, a capacitor array is provided in which the first set of capacitor plates of the first capacitor and the second set of capacitor plates of the second capacitor are formed using more than one screen head in a typical wet stacking process. Further, the capacitor array may be provided in which the first set of capacitor plates comprise at least a first top plate and a first bottom plate, the second set of capacitor plates comprise at least a second top plate and a second bottom plate, wherein the first top plate and the second top plate are not aligned at the same vertical level within the array. It is common to provide a capacitor array in which plates of the first capacitor and plates of the second capacitor are provided at different vertical levels in the array by applying conductive material and dielectric in multiple layers during manufacture.

In the arrangement of capacitors in the array, a designation scheme may be used in which letters "A", "B", and "C" and so forth are used to represent capacitors that are alike in their capacitance value. Thus, the ordering and the capacitance value of capacitors may be provided wherein the array may be represented by the designation ABBBA, for example. This "ABBBA" embodiment indicates an array having five capacitors in which the two capacitors at each end of the array (i.e. "A" capacitors) are of one specific capacitance value, while the three capacitors in the center of the array are of another different value, designated as "B". In another embodiment, an array of five capacitors may be provided by the designation ABABA, or alternatively AABAA. Other arrangements are possible as well.

In a four capacitor array, there are several possibilities, including: AAAA, ABBA, AABB, AAAB, ABAA, ABAB and the like.

In other embodiments of the invention, an electrical circuit board is presented with capacitor arrays attached to the board, in a generally planar board having on its surface a plurality of electrical current paths. Further, a capacitor array is provided comprising a first capacitor, the first capacitor comprising a first set of capacitor plates with dielectric between the plates, the first capacitor being capable of storing a predetermined electrical charge having a first value. Additionally, a second capacitor is provided, the second capacitor having a second set of capacitor plates with dielectric between the plates, the second capacitor being capable of storing a predetermined electrical charge having a second value. In some embodiments, there also is provided in the array a third capacitor, the third capacitor comprising a third set of capacitor plates with dielectric between the plates. The third capacitor is capable of storing a predetermined electrical charge having a third value. A fourth capacitor with a fourth set of capacitor plates with dielectric between the plates, the fourth capacitor being capable of storing a predetermined electrical charge having a fourth value. Other variations are possible as well.

Additionally, a method of making a capacitor array is disclosed which comprises providing a plurality of layers of dielectric material. Further, a plurality of layers of conductive material also are provided, the conductive material being located generally between layers of dielectric material. Then, the conductive material is hardened to form conductive plates, the conductive plates being adapted for interconnection to each other or to terminations capable of communicating with a circuit board. Then, the layers are stacked with dielectric material and conductive plates in a predetermined arrangement. In the method, the spacing of the conductive plates is provided to facilitate an appropriate capacitance value between the plates. Next, a first capacitor is formed, the first capacitor comprising a first set of capacitor plates, the first capacitor being capable of storing a predetermined electrical charge having a first value. A second capacitor is formed having a second set of capacitor plates, the second capacitor being capable of storing a predetermined electrical charge having a second value. Other methods employing three, four, five, six, or more capacitors in the array are possible, with a multitude of combinations of capacitance value and location on the array being possible.

In one embodiment of the invention, a resistor array, rather than a capacitor array, is provided, having a first resistor, the first resistor comprising a first set of plates, the first resistor being capable of resisting an electrical charge by an amount having a first value, and also a second resistor, the second resistor comprising a second set of resistor plates, the second resistor being capable of resisting an electrical charge by an amount having a second value.

In one embodiment of the invention, a varistor (voltage dependent resistor) array is provided, comprising a first varistor, the first varistor comprising a first set of plates, the first varistor being capable of absorbing a voltage transient of an electrical charge by an amount having a first value. Further, a second varistor is also part of the array, the second varistor comprising a second set of plates, the second varistor being capable of absorbing a voltage transient of an electrical charge by an amount having a second value.

A full and enabling disclosure of the present invention, including the best mode thereof, to one of ordinary skill in the art, is set forth more particularly in the remainder of the specification, including reference to the accompanying drawings provided in this specification. It is to be recognized, however, that the drawings show representative examples but do not limit the number of combinations and sub-combinations that may be possible in application of this invention in a manner consistent with the written description.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which:

FIG. 9 shows an another alternate configuration of the invention having a six capacitor array, shown as AABBAA;

FIG. 10 is an illustration of still another embodiment of a six capacitor array of the type designated ABABAB;

Figure 1:
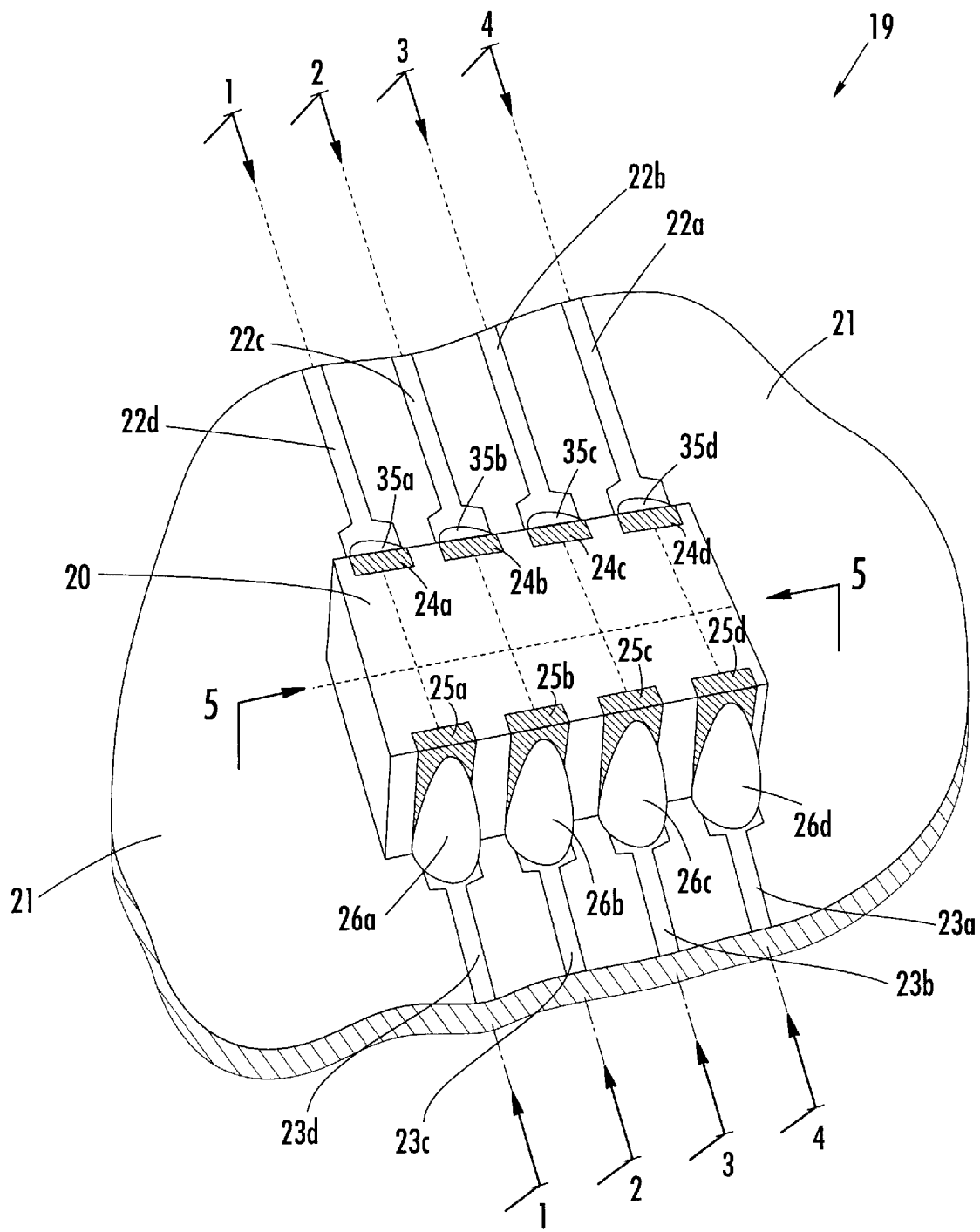
FIG. 1 is a perspective view of an array comprising four capacitors shown mounted on the surface of a printed circuit board.

Repeated use of reference characters in the present specification or drawings is intended to represent analogous features or elements of the invention.

DETAILED DESCRIPTION OF THE INVENTION

It is to be understood by one skilled in the art that the present discussion is a description of exemplary embodiments only, and is not intended as limiting the broader aspects of the present invention, which broader aspects are embodied in the exemplary constructions.

In the past few years, the miniaturization of cellular telephones, laptop computers and other such electronic devices has caused passive electronic component manufacturers to integrate components, such as capacitors, into smaller surface mountable packages or arrays. Integrated passive components ("IPCs") such as the capacitor arrays described herein offer a number of advantages in circuit board and layouts. Capacitor arrays offer space and cost savings, which may include increased capacitance per unit area and increased throughput during manufacturing and chip handling.

Several combinations of capacitance values may be provided in an array that is manufactured on the same production run. According to industry practice, the size of such devices may be expressed as a number "XXYY" with XX and YY being the length and width, respectively, of the component in hundredths of an inch.

Recently, miniaturization of electronic components has been accomplished using a reduction in the size of active electronic components. Additionally, there is a desire to reduce the size of passive components, such as capacitors. In applications for which space savings is a necessity, some manufacturers use separate, individually surface mounted components of smaller EIA (Electronic Industries Association) case dimensions such as, for example, 0603, 0504, and 0402. In some embodiments of this invention, it may be possible to apply these to smaller components in cases sizes as small as 0201, or even less.

A problem encountered when attempting to employ smaller capacitors in chip sizes as described is the reduction in volumes available for capacitance. For example, it is known that while 1206 and 0805 size discrete capacitors use about 40% of their total volumes for capacitance, the percentage of chip volume devoted to capacitance drops to only about 32% for 0603 chips and to less than 20% for a 0402 chip. This reduction in capacitance volumes as chip dimensions become reduced results in part because the margins and cover structures in the devices consume a larger percentage of the total volume when using or manufacturing the smaller chip sizes.

To achieve board area savings and increase capacitance volumes in a chip, it has been common practice in the industry to combine passive components into a built-in array. Using capacitor arrays, the clearance areas and mounting pads areas that otherwise would be required around each separate component sometimes may be eliminated (or at least may be reduced), leading to board space savings. Further, the EIA specifies that chips may not be thicker in cross-section than they are in width. Thus, an array configuration that facilitates the manufacture of a thicker array may be made thicker than a configuration which uses separate, individual capacitors by packing more capacitance ability in a given area on a board.

The process used in the internal construction of the chip, in one embodiment, uses a dual screen head ("SH") on a wet laydown stacking machine. Two or more complementary electrode patterns may be screen printed at specific intervals on the dielectric layers placed on glass plates, using processes which are known by those of skill in the art in the industry.

The invention and processes described herein for making four element multi-capacitance arrays (in an 0612 and 0508 configuration) may be directly adopted into other configurations for other arrays such as, for example: (1) two element 0405 arrays, (2) two element 0508 arrays, or (3) six element 0612 arrays.

In a further embodiment, the invention may comprise symmetrical dual capacitance values for a four element array offered in 0612 and 0508 EIA (Electronic Industries Association) case sizes.

Additional advantages of the present invention may be achieved using an electrical circuit arrangement comprising a generally planar circuit board having a plurality of electrical current paths defined thereon. The arrangement further includes a capacitor device formed by a device body having terminations located on side surfaces so as to define an input pair and an output pair. The device body is surface-mounted on the circuit board such that the terminations are electrically connected to respective current paths of the circuit board.

Board usage area for the 0508 four capacitor array in comparison to discrete 0402 chips shows the significant cost savings that may be achieved in the practice of this invention. For example, one 0508 four capacitor array occupies less space than four 0402 separate capacitors. Four separate 0402 capacitors, when mounted on a board and spaced, individually occupy about 0.031" in total length, and 0.082" total in width. But, when placed in an 0508 array as provided for in this invention, four capacitance values placed instead into a single chip occupies only about 0.08" in total length, and about 0.12" in total width. Thus, the total area of the 0508 array is only about 0.0096 in$^2$, whereas the total area of the four separate 0402 chips, when mounted with appropriate spacing, is significantly greater, i.e. about 0.0107 in$^2$. Thus, using this invention, capacitance values may be placed on less "real estate" on the surface of the integrated circuit, achieving greater miniaturization. This is possible, in part, by eliminating the necessity for spacing requirements required for single chips when mounted on the board surface by using multiple capacitor arrays of a predetermined configuration.

The 0508 capacitor array has an advantage that it can be made thicker (to the maximum thickness of 0.05 mils), unlike the 0402 single capacitor chips in which the thickness of the capacitor chip is limited to only about 0.02 mils. Thus, in the application of this invention, it is possible to achieve higher capacitance per unit area. Besides higher capacitance, the capacitor array of this invention may also reduce handling problems and placement errors that are sometimes encountered when chips are laid out on a board.

To increase the capacitance in such arrays, and still secure them into the required package sizes, higher actives and thinner dielectric layers may be used. The reduction in voltage ratings on such devices enables the use of thin dielectric layers (i.e. less than about 6 um). To achieve this development in materials, machine and clean room technologies have advanced as well.

One aspect of the invention includes prototyping of capacitor arrays having two or more capacitor values in a single package or structure. For example, the arrays may be built with four elements (i.e. four capacitance elements) in a 0612 package configuration. The designs may incorporate a 1-2-1 layout, eliminating the need to maintain orientation of the capacitor. This allows more flexibility in manufacturing by avoiding the need to orient the capacitor among two or more different orientations.

In wet stacking machine processes, which construct the arrays by providing multiple layers of electrodes separated by dielectric, there are at least two methods of making such arrays. First, it is possible using a single screen head machine and "floating electrodes" to construct, as examples, four, six, eight, or ten capacitor arrays. Further, using a dual screen head machine, it is possible to build multiple value capacitor arrays by stacking the outer elements with respect to the inner elements of the array at periodic intervals.

This invention also could be applied using traditional tape casting procedures, but wet stacking processes are quite useful because of their accuracy, reproducibility, and ease of use.

In the wet stacking process, using the dual screenhead machine, it is possible to build the multiple value capacitor arrays by stacking the outer elements with respect to the inner elements of the array at periodic intervals. Dual screenhead stacking of capacitor arrays sometimes provides a wider range of product offerings with the opportunity for independent adjustment of the two capacitor values in the array.

Turning now to FIG. 1, capacitor array 19 of the present invention is shown surface mounted to a printed circuit board 21. Array body 20 is inverted so that terminal structures on its "top" are electrically connected to circuit traces of the circuit board 21. Traces 22a, 22b, 22c, and 22d may be seen on the upper portion of the Figure, while traces 23a, 23b, 23c, and 23d are seen on the lower portion of FIG. 1. The electrical connection of the array body 20 to the traces typically is supplied by solder joints 26a, 26b, 26c and 26d, which also function to maintain array body 20 in its physical location on the board. Also, solder joints 35a–d are provided on the opposite side of the array body 20. Terminals 24a–d and terminals 25a–d are seen on each edge of the array body.

Figure 2:
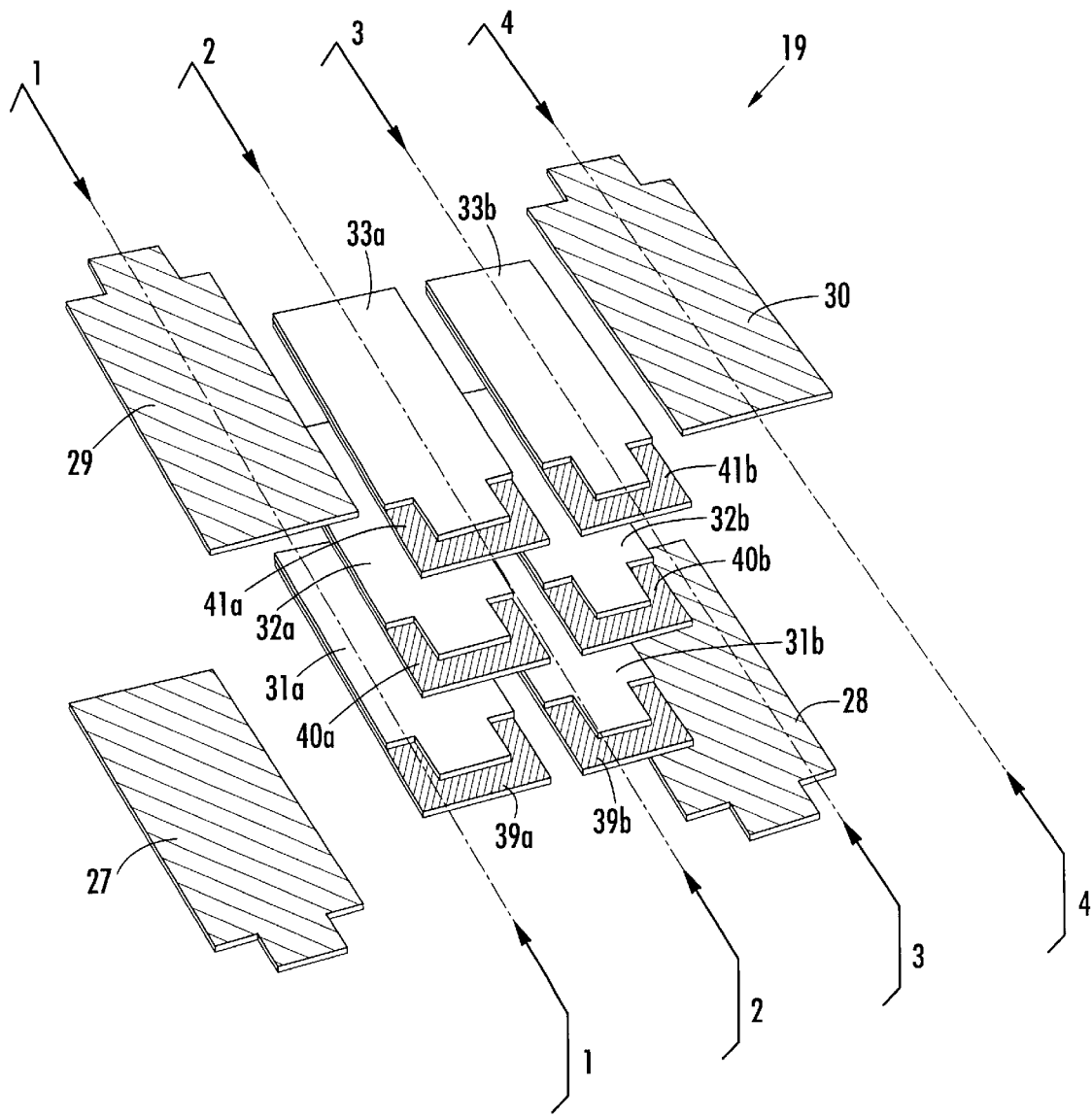
FIG. 2 shows a perspective exploded internal view of the array of FIG. 1.

Referring now to FIG. 2, capacitor array 19 is seen in an exploded view configured as an integrated array having a plurality of electrode plates. In particular, lower left plate 27, lower right plate 28, upper left plate 29, and upper right plate 30 are shown at the corners, respectively, of FIG. 2.

Plates at the same vertical level are formed at the same time, as a lay-down layer in a wet stacking process. Thus, lower left plate 27 and lower right plate 28 would be formed during the same layering of conductive material pursuant to a wet stacking and layering process. A series of conductive layers are built up in this fashion, and it is therefore possible to custom design or custom build capacitor arrays having any configuration or number of capacitors, of any capacitance value, which may be desirable in a given end product electronic application. An array built in this way saves board space, and can be less costly than manufacturing and mounting upon a board separate capacitors. Thus, a custom designed capacitor array is very desirable.

In a preferred embodiment, two screen heads can produce a capacitor array having four capacitors, however, more screen heads can be used to provide capacitor arrays having a multitude of combinations of capacitance, in various orientations on the array.

FIG. 2 shows only conductive layers, and does not specifically show the dielectric, which can be seen in other Figures. Lower middle plates 31a–b, center middle plates 32a–b, and upper middle plates 33a–b are seen in the center of the FIG. 2. These plates are interleaved with other plates that are located in-between them, namely, plates 39a–b, 40a–b, and 41a–b.

Figure 3:
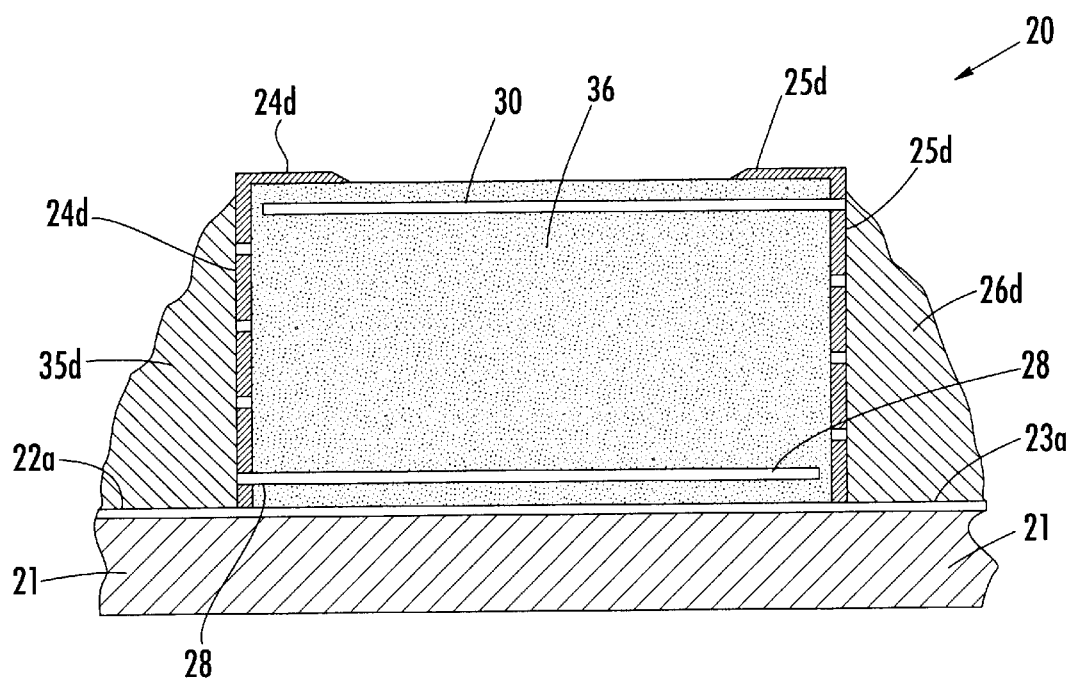
FIG. 3 is a cross-sectional view as taken along (line 4—4 of FIG. 1.

FIG. 3 shows a cross-sectional view as taken along line 4—4 of FIG. 1. Solder joint 26d is seen at the right side of the Figure, and it communicates electrically with terminal 25d, which also is connected to circuit board 21. Trace 23a is seen on the surface of the circuit board 21. Solder joint 35d holds the array body down upon the circuit board 21, and seen on the left side of FIG. 3. Dielectric matrix 36 is seen between upper right plate 30 and lower right plate 28.

Figure 4:
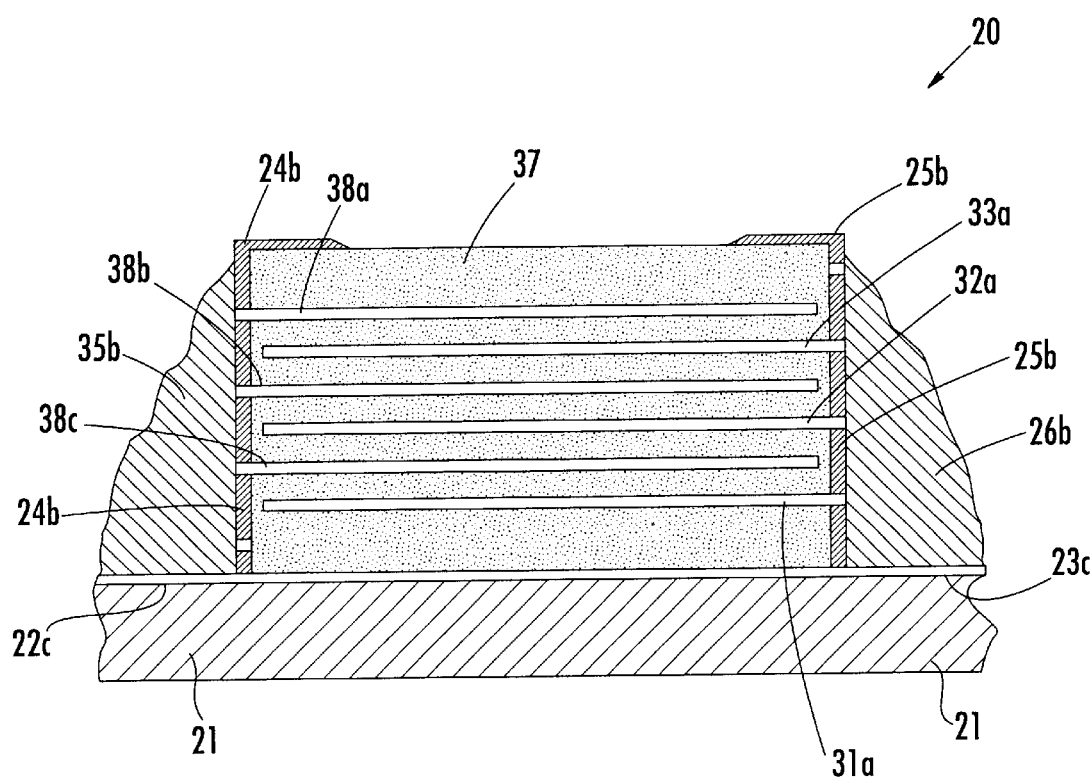
FIG. 4 is a cross-sectional view as taken along line 2—2 of FIG. 1.

In FIG. 4, many of the same structures shown in FIG. 3 may be seen, including posterior conductive plates 38a–c, which project from one side of the array body 20 to interleave or sandwich between other conductive plates. The other plates include lower middle plate 31a, center middle plate 32a, and upper middle plate 33a which are seen on the right side of FIG. 4.

Figure 5:
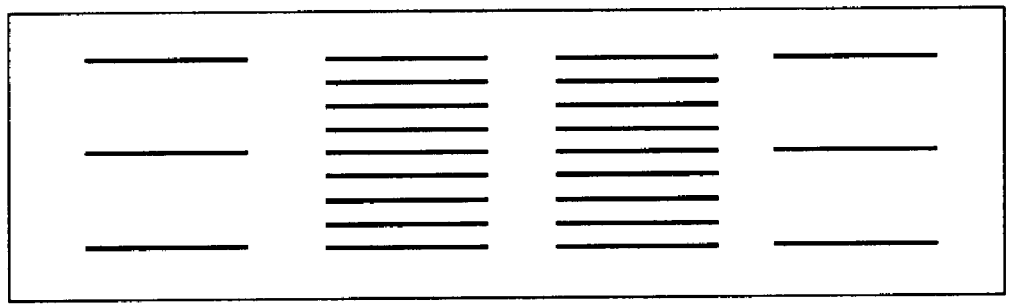
FIG. 5 shows a side view of one portion of a four capacitor array in which the outer capacitors (C1 and C4) are of the same capacitance value, while the inner capacitors C2 and C3 are provided with a different and distinct capacitance value.

FIG. 5 shows a side view of a four capacitor array chip without end terminations, as for example along lines 5—5 of FIGS. 1 and 2. The outer capacitors C1 and C4 in this particular example are of about the same capacitance value, while the inner capacitors of the array, C2 and C3, also are approximately equal in value. The values are not the same, that is, C2/C3 are at a different capacitance value than the C1/C4 pair. In FIG. 5, C2 and C3 contain more conductive electrodes, and a thinner dielectric between electrodes, resulting in a higher capacitance as compared to C1 and C4. In this example, and in other examples, precise control of dielectric layer properties can facilitate a capacitance value of 100:1, or greater, or perhaps less, such as a factor of 10:1 or less.

Figure 6:
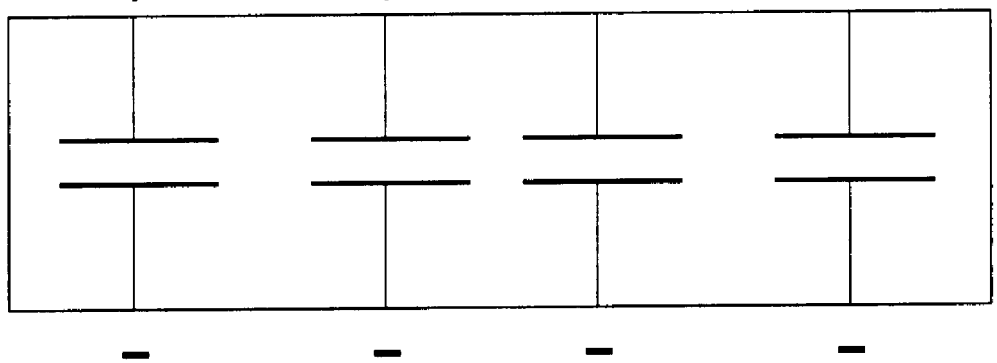
FIG. 6 shows an electrical diagram of the chip shown in FIG. 5.

Turning now to FIG. 6, the electrical schematic shows a diagram of electrical charge that can be stored in each capacitor C1, C2, C3, and C4 of this particular four capacitor array. In most cases, the positive poles are aligned along the same side of the array, as shown in the particular embodiment of FIG. 6. However, other alternative embodiments may be used in which positive and negative poles of the capacitors are aligned opposite each other, or in a staggered configuration, as placed on a circuit board. The configuration depends largely upon the circuit board design and the specific requirements of the electronic circuit board manufacturer.

Figure 7:
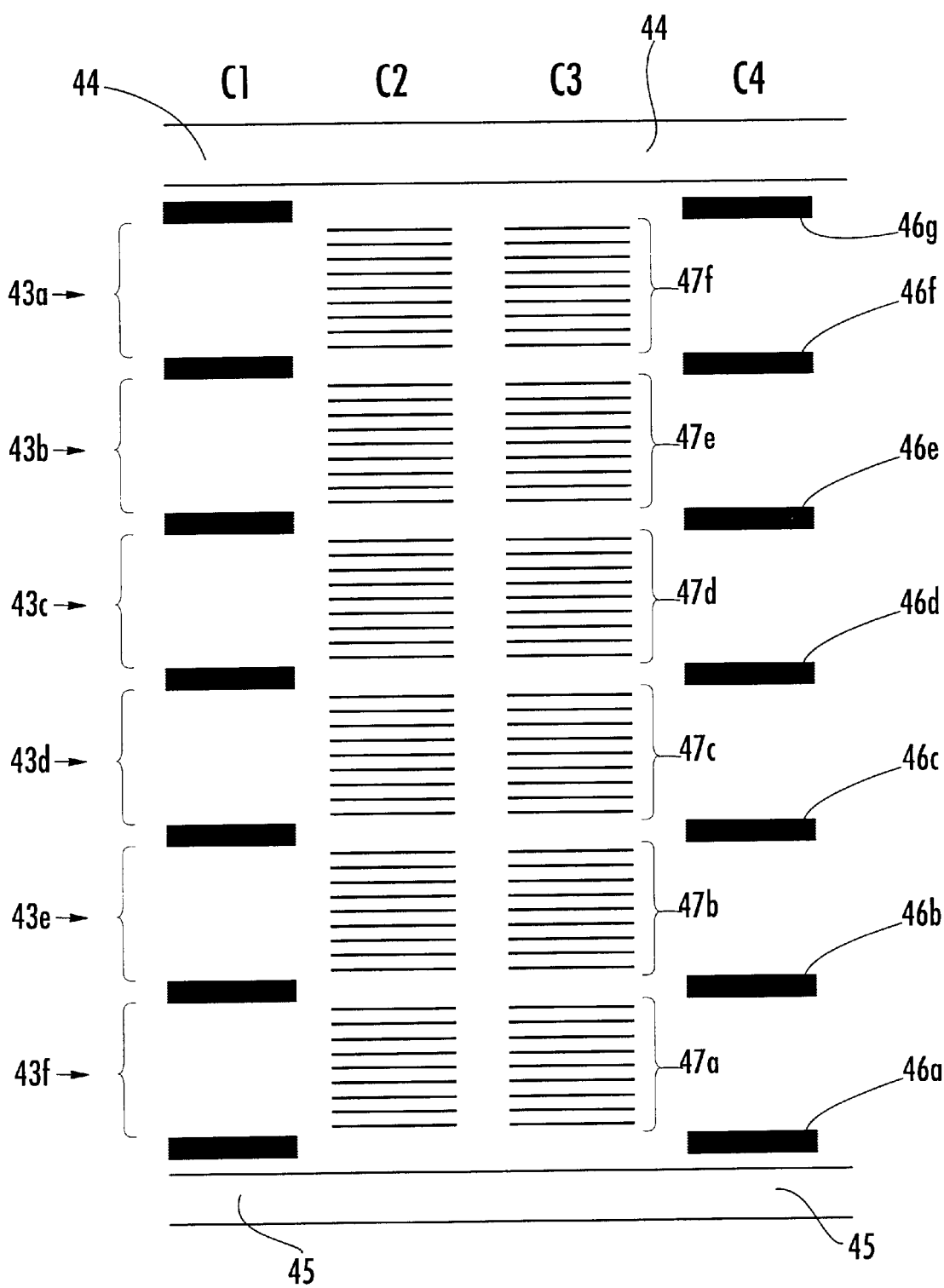
FIG. 7 shows an internal cross-sectional view along line 5—5 of FIG. 1.

Turning now to FIG. 7, build-ups may be performed according to the wet stacking methods described above to make a dual value capacitor arrays reproducibly. The capacitor elements at the outer ends of the array (C1 and C4) shown in FIG. 7 may be designed to afford a capacitor value of about 1 nF, while those at the center of the array (C2 and C3) are designed to achieve a capacitance value of about 100 nF (nF=nanofarad). In FIG. 7, a top ceramic cover layer 44 and a bottom ceramic cover layer 45 are seen on the upper and lower sides of the array, respectively.

Two complementary pattern targets were designed, such that upon overlaying the layers of the capacitor, the four ends of one capacitor were aligned with the other precisely, in a pattern similar to the normal 0612 target. On the wet stacking process machine the first screenhead (with screen made from one target) may be precisely aligned with a second screenhead within an error of 1–2 mils. The build-up can be completed after a sequence of electrodes are laid out from both the first and second screenheads at various intervals.

The longitudinal cross section of the green chip (prior to sintering) is shown in FIG. 7. FIG. 7 shows a dual capacitance chip in longitudinal cross-section showing internal design of the conductive elements, which are separated by dielectric. Six separate "actives" shown as actives 43a–f may be seen on the outer ends of the chip (C1/C4), and these actives are separated by a distance of about 4.38 mils each. On the inner portions of the chip, on C2/C3, eight electrodes 47 are provided, in six sets, as seen on the Figure. Electrodes 46a–g are formed by the first screenhead, while electrodes 47a–f are formed by the second screenhead. Likewise, the electrodes of C1 are formed by the first screenhead, while the electrodes of C2 are formed by the second screenhead.

The design concept shown above in FIG. 7 for making the 0612 dual cap value prototype chip may be used to produce a series of multi-capacitor arrays in different package sizes capacitance ratios from ratios as near as about 1:1 to high as about 1:100 or more. Examples are provided below. In all of these listed examples, barium titanate is used as the dielectric material, which is well known in the industry as a suitable dielectric for capacitors and the like. As to the metals, it is possible to use noble metals as conductive materials. Conductive materials may include metals such as silver, paladium, platinum, or base metals such as nickel and copper.

Figure 8:
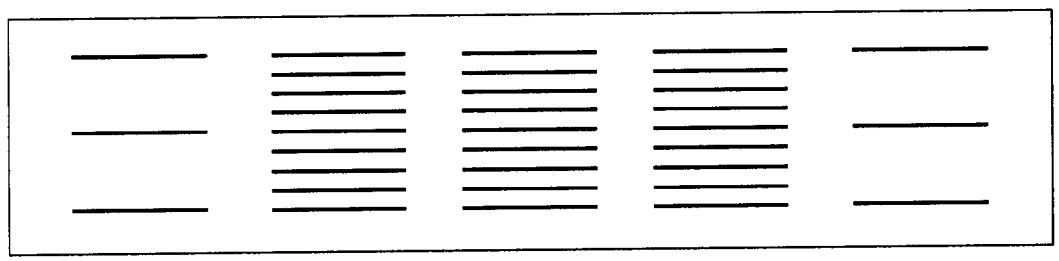
FIG. 8 illustrates an alternative embodiment of the invention having five capacitors in an array, configured as ABBBA.

FIG. 8 shows a five capacitor array having two outer capacitors of the same value, and three inner capacitors of a different value. The pattern shown in FIG. 5 may be designated ABBBA.

Figures 9, 10:
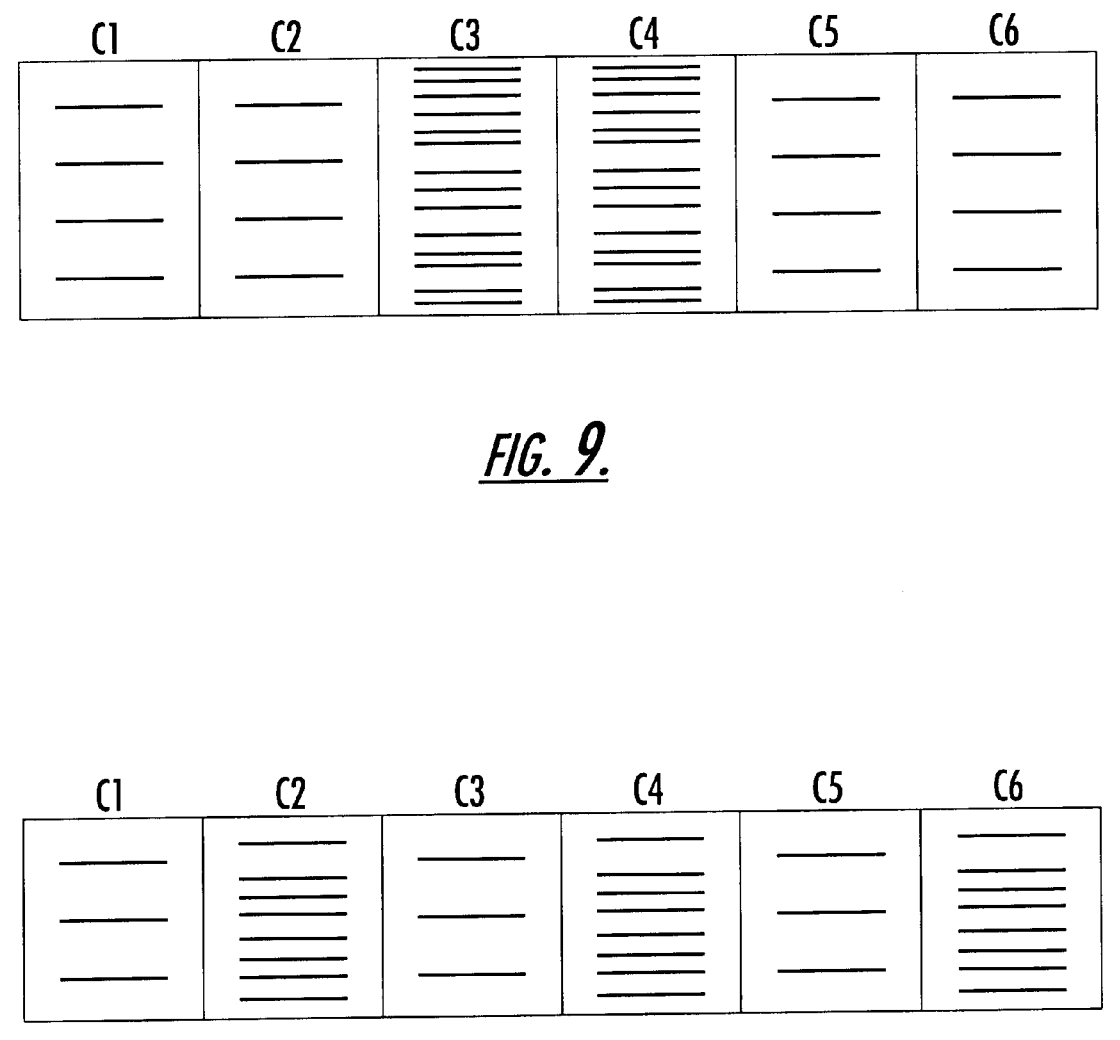

FIG. 9 reveals a six capacitor array having a pattern denoted AABBAA. Two values of capacitance are represented.

In FIG. 10, a dual value capacitor array is shown utilizing the pattern ABABAB.

Figure 11:
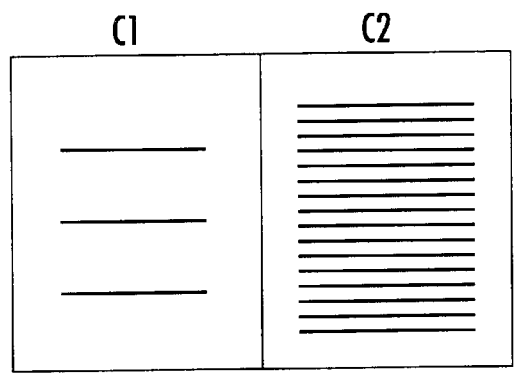
FIG. 11 shows a two element dual capacitor array (i.e. AB) having two different capacitance values.

FIG. 11 shows a dual value capacitor array, using the pattern AB.

Figure 12:
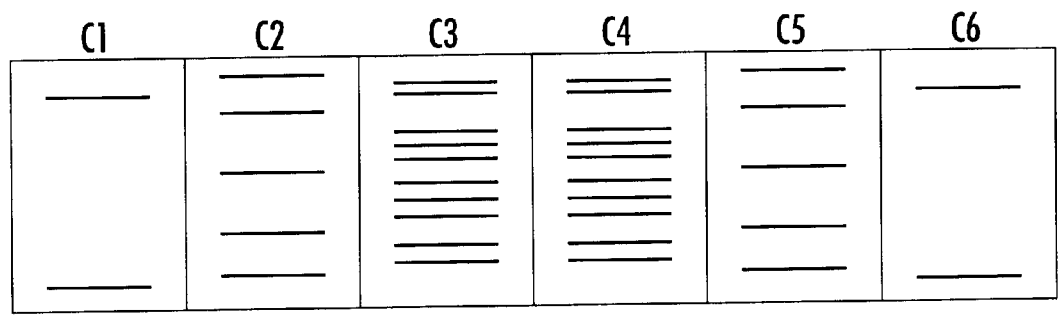
FIG. 12 shows still another embodiment of a six capacitor array having three different capacitance values, designated as ABCCBA.

FIG. 12 is a sketch of a triple value capacitor array, having the pattern ABCCBA. Capacitor arrays having three, four, five, six, or more different and unique capacitance values may be constructed, using many different combinations of geometries or arrangements on the array. Different circuit board requirements will dictate the arrays that may be necessary to implement the invention, and the combinations shown in these Examples are but a few of many that can be implemented using this invention.

It often will be desirable to utilize a dielectric material exhibiting a dielectric constant of approximately 100 or more. A dielectric constant of greater than approximately 500 will often be preferred, with a dielectric constant of approximately 3000 being used in some exemplary embodiments. Barium titanate is a preferred dielectric, but other dielectric materials easily could be substituted in the practice of the invention.

Certain lead-based dielectrics, such as $Pb(Zr,Ti)O_3$ (referred to as PZT), are also suitable for this purpose. The PZT may be doped with Nb, thereby yielding a PNZT material. Various aspects of PZT dielectrics are discussed in U.S. Pat. No. 5,625,529 to Lee, incorporated herein by reference.

The various layers located on array body may be protected by a suitable encapsulate. The encapsulate may comprise a primary passivation layer of SiN or the like. A secondary passivation layer of a suitable polymer material may also be provided. One such polymer material that may be utilized for this purpose is benzocyclobutene (BCB). The use of BCB as a polymer coating to a primary passivation layer is discussed in A.J.G. Strandjord et al., "Photosensitive Benzocyclobutene for Stress-Buffer and Passivation Applications (One Mask Manufacturing Process)" 1997 Electronic Components and Technology Conference, incorporated herein by reference.

In exemplary embodiments, the traces 22a–d and 23a–d may be comprised of a layer of platinum metallization that has been patterned according to conventional processing techniques.

A Chromium/Nickel layer, followed by a Silver/Lead layer, applied by typical processing techniques such as sputtering, is suitable for use as an outer conductive layer on the terminations (not shown). The various layers may be encapsulated as well. The encapsulate material may be patterned, such as by etching, to expose the terminal structures.

This invention provides integrated capacitor arrays having the advantages of being very small while also providing relatively large capacitance values at each capacitor. In some embodiments, integrated circuit fabrication techniques facilitate the integration of ferroelectric materials in a surface mountable electronic device.

This invention may be applied equally as well to multi-element resistor and varistor arrays. That is, the capacitors shown in the Examples of this application could be constructed not as capacitors, but instead constructed as resistors or varistors, with relatively straightforward modifications. To construct a resistor, it would be necessary to substitute a thicker electrode and a thinner dielectric. To construct a varistor, it would likely have the same conductor, but a different dielectric, such as for example, zinc oxide.

Examples of the invention are provided below.

EXAMPLE 1

In this Example, a 0612 four capacitor dual value array (i.e. two separate capacitance values) is provided as shown and described above in connection with FIG. 7. The layering or build-ups may be performed according to the methods described above to make a dual value capacitor array having a pattern denoted as ABBA. The capacitor elements at the outer ends of the array (C1 and C4), as shown in FIG. 7, are designed to afford a capacitor value of about 1 nF ("nF" denotes a nanoFarad), while those at the center of the array (C2 and C3) are designed to achieve a capacitance value of about 100 nF. A top ceramic cover layer and a bottom ceramic cover layer are provided on the exterior (top and bottom) of the body of the device.

FIG. 7 shows this dual capacitance chip in longitudinal cross-section, which reveals its internal design of conductive elements, which are separated by dielectric. Six separate "actives" shown as actives 43a–f may be seen on the outer ends of the chip (C1/C4) separated by a certain fixed distance. On the inner portions of the chip, that is, on C2/C3, eight electrodes 47 are provided, in six sets. Electrodes 46a–g are formed by the first screenhead, while electrodes 47a–f are formed by the second screenhead. Likewise, the electrodes of C1 are formed by the first screenhead, while the electrodes of C2 are formed by the second screenhead.

EXAMPLE 2

In a second Example, an 0508 four element dual capacitance array is provided and constructed having a smaller outer dimension, but the same electrical properties (and the same internal construction) as provided in Example 1. The difference is the case size is smaller in this Example. The outer case package is 80 mils long (i.e. length is usually measured from one termination to another end termination, such as, for example, along line 5—5 in FIG. 1). The outer package is 50 mils wide with four capacitor elements. The outer pairs and inner pairs are of a different capacitance, with a sequence of ABBA. Thus, the outer two capacitors are of the same electrical value, while the inner two capacitors are also of the same capacitative value. This Example provides possible capacitance combinations including the following (shown as an array, i.e. A:B:B:A, respectively):

a) 100 pF:1000 pF:1000 pF:100 pF;
b) 1 nF:10 nF:10 nF:1 nF; or
c) 1 nF:100 nF:100 nF:1 nF.

EXAMPLE 3

An 0405 two element dual capacitance array is provided that is about 50 mils long and about 40 mils wide in which the termination ends are the longer side (with the two elements having a different capacitance value, per sequence "AB" similar to that design shown in FIG. 11). Examples of combinations that may be utilized in this Example include ratios of first values to second values of:

| a) | 100 pF: | 1 nF (as 1:100:100:1, for example) |
| b) | 100 pF: | 10 nF (as 10:100:100:10, for example) |
| c) | 1 nF: | 100 nF (as 1:100:100:1, for example) |
| d) | 10 nF: | 100 nF (as 10:100:100:10, for example) |
| e) | 1 nF: | 10 nF (as 1:10:10:1, for example) |

Other combinations also are possible, and the larger capacitance values could be placed on the outside of the array, as for example, (a) above could be provided as on an array as 100:1:1:100, or even 100:1:100:1. Likewise, numerous combinations are possible using (b) through (e) above as well.

EXAMPLE 4

This Example provides an 0612 five element dual capacitance array that is about 120 mils long (i.e. as along C1 to C5 in FIG. 8) and about 60 mils wide with five elements having two different capacitance values in the array (sequence ABBBA). Combinations of arrays that may be constructed by way of this Example include all combinations that may be constructed using two different capacitance values, including without limitation, those as follows:

| 1 nF : 100 nF : 100 nF : 100 nF : 1 nF |
| --- |

Likewise, an array having the combinations ABABA, AABBB, AABAA, AABBA, BBABB, and others may be constructed.

EXAMPLE 5

A 1218 six element dual capacitance array is constructed using an array device that is about 180 mils long and about 120 mils wide with six elements in the package having two different capacitance values (i.e. for example, using the sequence AABBAA; see also FIG. 9 for an example on how this arrangement may be implemented). Examples of various combinations of capacitance that may be utilized in this configuration include (where $\mu F$=microfarads):

| 10 nF : 10 nF : 1 $\mu F$ : 1 $\mu F$ : 10 nF : 10 nF |
| --- |
| 100 nF : 100 nF : 1 $\mu F$ : 1 $\mu F$ : 100 nF : 100 nF |

EXAMPLE 6

In another example, a 1218 six element dual capacitance array may be provided using a device that is about 180 mils long and about 120 mils wide with six elements in the package having two different capacitance values (i.e. using the sequence ABABAB, for example). Example of other combinations that could be used include AAABBB, AABBAA, AAABAA, AAAAAB, AAAABA, ABBBBA, ABBABA, ABBBBA, ABABAA, ABAAAA, ABBBBB, and others. In this Example, the values could be placed on an array using the configuration ABABAB,

| 100 nF : 1 $\mu F$ : 100 nF : 1 $\mu F$ : 100 nF : 1 $\mu F$ |
| --- |
| 10 nF : 1 $\mu F$ : 10 nF : 1 $\mu F$ : 10 nF : 1 $\mu F$ |

Other combinations could be used as well, with various capacitance values.

EXAMPLE 7

A 1218 six element triple value capacitance array can be employed using a device that is about 180 mils long and about 120 mils wide with six elements in the package having three different and unique capacitance values (i.e. using a sequence ABCCBA). Other sequences that can be used include ABABCC, ACBBCA, AABBCC, AABCBC, AACBCB, BBCCAA, BCAABC, BCABAC, ABCCCC, CBABBB, BACCAC and others which include three different values in the array, and a total of six capacitors. FIG. 12, for example, illustrates a triple value capacitance array having three different, unique capacitance values. Examples of combinations include, for example:

10 nF : 100 nF : 1 µF : 1 µF : 100 nF : 10 nF

EXAMPLE 8

An 0204 two element dual capacitance array may be provided using a device that is about 40 mils long and about 20 mils wide with two elements having different capacitance value (as per the sequence AB; similar to that shown in FIG. 11). Examples of combinations include, but are not limited to, the following:

| | |
|---|---|
| 100 pF : | 10 nF |
| 100 pF : | 1 nF |
| 1 nF : | 10 nF |

EXAMPLE 9

A 0603 two element dual capacitance array is a device that is about 60 mils long and about 30 mils wide with two elements having different capacitance values (per sequence AB). Examples of combinations that may be construed include:

100 pF : 10 nF
100 pF : 1 nF
1 nF : 10 nF

EXAMPLE 10

A 0612 two element dual resistor array is a device that is about 120 mils long and about 60 mils wide with two elements having different resistance values (per sequence AB). Examples of combinations include:

1 ohm : 10 ohm
10 ohm : 100 ohm

A similar device may be constructed in smaller case sizes such as 0405 or 0204.

EXAMPLE 11

An 0612 two element dual varistor array is provided using a device that is about 120 mils long and about 60 mils wide with two elements having different voltage variations in the same package (per sequence AB). Examples of combinations that can be used include (where V=volts):

5.5V : 9V
9V : 18V

The varistor device may be constructed in smaller case sizes such as 0405 and 0204, as well.

What is claimed is:

1. A capacitor array of a parallel capacitor arranged in a single manufactured unit, comprising
    a first capacitor, the first capacitor comprising a first set of capacitor plates, the first capacitor being capable of storing a predetermined electrical charge having a first value;
    a first pair of terminations provided at opposing peripheral sides of the single manufactured unit, wherein said first pair of terminations provides respective electrical connection to selected of the first set of capacitor plates such that said first capacitor is configured for distinct circuit connection thereto;
    a second capacitor, the second capacitor comprising a second set of capacitor plates, the second capacitor being capable of storing a predetermined electrical charge having a second value, wherein the first value and the second value are not the same, such that the capacitor array comprises at least two capacitors that differ in capacitance value; and
    a second pair of terminations provided at opposing peripheral sides of the single manufactured unit, wherein said second pair of terminations provides respective electrical connection to selected of the second set of capacitor plates such that said second capacitor is configured for distinct circuit connection thereto;
    wherein the capacitors are encased in a dielectric material.

2. The capacitor array of claim 1 wherein the capacitor plates of the first capacitor and the capacitor splates of the second capacitor are formed by combining alternating layers of dielectric and conductive materials.

3. The capacitor array of claim 1 additionally comprising:
    a third capacitor, the third capacitor comprising a third set of capacitor plates, the third capacitor being capable of storing a predetermined electrical charge having a third value; and
    a third pair of terminations provided at opposing peripheral sides of the single manufactured unit, wherein said third pair of terminations provides respective electrical connection to selected of the third set of capacitor plates such that said third capacitor is configured for distinct circuit connection thereto.

4. The capacitor array of claim 3 additionally comprising:
    a fourth capacitor, the fourth capacitor comprising a fourth set of capacitor plates, the fourth capacitor being capable of storing a predetermined electrical charge having a fourth value; and
    a fourth pair of terminations provided at opposing peripheral sides of the single manufactured unit, wherein said fourth pair of terminations provides respective electrical connection to selected of the fourth set of capacitor plates such that said fourth capacitor is configured for distinct circuit connection thereto.

5. The capacitor array of claim 4 wherein the second and third capacitors are located on the array between the first and fourth capacitors, further wherein the first value of the first capacitor and the fourth value of the fourth capacitor are about the same.

6. The capacitor array of claim 5 wherein the second value and the third value are about the same.

7. The capacitor array of claim 1 in which the first value and the second value differ from each other by at least a factor of 2.

8. The capacitor array of claim 1 in which the first set of capacitor plates of the first capacitor and the second set of capacitor plates of the second capacitor are formed such that the conductive material of one layer is independently formed at a different vertical height from conductive material in adjacent layers using more than one screen head.

9. The capacitor array of claim 1 in which:
   (a) the first set of capacitor plates comprise at least a first top plate and a first bottom plate;
   (b) the second set of capacitor plates comprise at least a second top plate and a second bottom plate;
   (c) further wherein the first top plate and the second top plate are not aligned at the same vertical position within the array.

10. The capacitor array of claim 1 in which:
    (a) the first set of capacitor plates comprise at least a first top plate and a first bottom plate;
    (b) the second set of capacitor plates comprise at least a second top plate and a second bottom plate;
    (c) further wherein the first bottom plate and the second bottom plate are aligned at different vertical positions within the array.

11. The capacitor array of claim 10 in which alignment of the plates of the first capacitor and the plates of the second capacitor are provided at different vertical levels in the array, wherein said alignment is facilitated in part by applying conductive material and dielectric in multiple layers during manufacture.

12. A capacitor array of parallel capacitors constructed by multiple layer deposition and arranged in a single manufactured unit, comprising:
    a first capacitor, the first capacitor comprising a first set of capacitor plates with dielectric between the plates, the first capacitor being capable of storing a predetermined electrical charge having a first value;
    a second capacitor, the second capacitor comprising a second set of capacitor plates with dielectric between the plates, the second capacitor being capable of storing a predetermined electrical charge having a second value;
    a third capacitor, the third capacitor comprising a third set of capacitor plates with dielectric between the plates, the third capacitor being capable of storing a predetermined electrical charge having a third value;
    a fourth capacitor, the fourth capacitor comprising a fourth set of capacitor plates with dielectric between the plates, the fourth capacitor being capable of storing a predetermined electrical charge having a fourth value; and
    first, second, third and fourth respective pairs of terminations provided at opposing peripheral sides of the single manufactured unit, wherein each pair of terminations provides respective electrical connection to selected of the first, second, third and fourth respective sets of capacitor plates such that each first, second, third and fourth capacitor is respectively configured for distinct circuit connection thereto;
    wherein at least two of said first, second, third, and fourth values are not the same; and
    further wherein said capacitor array is encased in dielectric.

13. The array of claim 12 in which two of the first, second, third, and fourth values are approximately equal in value, and the remaining two of said values also are approximately equal in value, the latter two being of a different value than the former two.

14. The array of claim 12 in which the first capacitor is located on the first end of the array, and the fourth capacitor is located on the second end of the array.

15. The array of claim 14 in which the first and fourth values are about the same.

16. The array of claim 14 in which the second and third values are about the same.

17. The array of claim 12 in which the total number of different capacitance values among the group comprising: the first value, second value, third value, and fourth values, comprises at least two different capacitance values.

18. The array of claim 12 additionally comprising:
    a fifth capacitor, the fifth capacitor comprising a fifth set of capacitor plates with dielectric between the plates, the fifth capacitor being capable of storing a predetermined electrical charge having a fifth value; and
    a fifth pair of terminations provided at opposing peripheral sides of the single manufactured unit, wherein said fifth pair of terminations provides respective electrical connection to selected of the fifth set of capacitor plates such that said fifth capacitor is configured for distinct circuit connection thereto.

19. The array of claim 18 wherein the capacitance values of the array are represented with like values having the same letter designator, such that the sequence and number of capacitance values is provided using a series of letters in a sequence to denote value and relative location of capacitance values in the array, in which capacitance values are represented by the designation ABBBA.

20. The array of claim 18 wherein the capacitance values of the array are represented with like values having the same letter designator, such that the sequence and number of the capacitance values are provided using a series of letters in a sequence to denote value and relative location of capacitance values in the array, in which capacitance values are represented by the designation ABABA.

21. The array of claim 18 wherein the capacitance values of the array are represented with like values having the same letter designator, such that the sequence and number of the capacitance values are provided using a series of letters in a sequence to denote value and relative location of capacitance values in the array, in which capacitance values are represented by the designation AABAA.

22. A capacitor array, comprising:
    a first capacitor, the first capacitor comprising a first set of capacitor plates with dielectric between the plates, the first capacitor being capable of storing a predetermined electrical charge having a first value;
    a second capacitor, the second capacitor comprising a second set of capacitor plates with dielectric between the plates, the second capacitor being capable of storing a predetermined electrical charge having a second value;
    a third capacitor, the third capacitor comprising a third set of capacitor plates with dielectric between the plates, the third capacitor being capable of storing a predetermined electrical charge having a second value;
    a fourth capacitor, the fourth capacitor comprising a fourth set of capacitor plates with dielectric between the plates, the fourth capacitor being capable of storing a predetermined electrical charge having a first value; and
    first, second, third and fourth respective pairs of terminations provided at opposing peripheral sides of the capacitor array, wherein each pair of terminations provides respective electrical connection to selected of the first, second, third and fourth respective sets of capacitor plates such that each first, second, third and fourth capacitor is respectively configured for distinct circuit connection thereto;

wherein the first and fourth capacitors each exhibit the first value, and the second and third capacitors each exhibit the second value, the first value and second values differing from each other by at least a factor of about 2:1; and further wherein said capacitor array is encased in a dielectric.

23. The capacitor array of claim 22 wherein the first and second values differ from each other by at least a factor of about 10:1.

24. The capacitor array of claim 22 wherein the first and second values differ from each other by at least a factor of 100:1.

25. The capacitor array of claim 22 in which the respective ordering of the capacitors on the array is in the following order: the first capacitor, the second capacitor, the third capacitor, and the fourth capacitor, respectively.

26. The capacitor array of claim 22 in which the respective ordering of the capacitors on the array is in the following order: the second capacitor, the first capacitor, the fourth capacitor, and the third capacitor, respectively.

27. The capacitor array of claim 22 in which the respective ordering of the capacitors on the array is in the following order: the first capacitor, the second capacitor, the fourth capacitor, and the third capacitor, respectively.

28. An electrical circuit board having at least one capacitor array attached thereto, comprising:
   (a) a generally planar circuit board having a plurality of electrical current paths thereon; and
   (b) a capacitor array comprising
      (i) a first capacitor, the first capacitor comprising a first set of capacitor plates with dielectric between the plates, the first capacitor being capable of storing a predetermined electrical charge having a first value;
      (ii) a second capacitor, the second capacitor comprising a second set of capacitor plates with dielectric between the plates, the second capacitor being capable of storing a predetermined electrical charge having a second value;
      (iii) a third capacitor, the third capacitor comprising a third set of capacitor plates with dielectric between the plates, the third capacitor being capable of storing a predetermined electrical charge having a third value;
      (iv) a fourth capacitor, the fourth capacitor comprising a fourth set of capacitor plates with dielectric between the plates, the fourth capacitor being capable of storing a predetermined electrical charge having a fourth value; and
      (v) first, second, third and fourth respective pairs of terminations provided at opposing peripheral sides of the capacitor array, wherein each pair of terminations provides respective electrical connection to selected of the first, second, third and fourth respective sets of capacitor plates such that each first, second, third and fourth capacitor is respectively configured for distinct circuit connection thereto;
   wherein each said termination is connected to a selected electrical current path on said generally planar circuit board; and
   wherein the first value and the second value are not the same, and further wherein said capacitor array is encased in a dielectric.

29. The circuit board of claim 28 in which the first, second, third, and fourth values are not identical.

30. The circuit board of claim 28 in which the first capacitor is located on the first end of the array, and the fourth capacitor is located on the second end of the array.

31. The circuit board of claim 28 in which the first and fourth values are about the same.

32. The circuit board of claim 28 in which the second and third values are about the same.

33. The circuit board of claim 28 in which the total number of different capacitance values among the group comprising: the first value, the second value, the third value, and the fourth values; comprises at least two different capacitance values.

34. The circuit board of claim 28 additionally comprising:
   a fifth capacitor, the fifth capacitor comprising a fifth set of capacitor plates with dielectric between the plates, the fifth capacitor being capable of storing a predetermined electrical charge having a fifth value; and
   a fifth pair of terminations provided at opposing peripheral sides of the capacitor array, wherein said fifth pair of terminations provides respective electrical connection to selected of the fifth set of capacitor plates such that said fifth capacitor is configured for distinct circuit connection thereto.

35. The circuit board of claim 34 wherein the capacitance values of the array may be represented by the designation ABBBA.

36. The circuit board of claim 34 wherein the capacitance values of the array may be represented by the designation ABABA.

37. The circuit board of claim 34 wherein the capacitance values of the array may be represented by the designation AABAA.

38. An electrical circuit board having at least one capacitor array attached thereto, comprising:
   (a) a generally planar board having a plurality of electrical current paths thereon; and
   (b) a capacitor array comprising:
      a first capacitor, the first capacitor comprising a first set of capacitor plates with dielectric between the plates, the first capacitor being capable of storing a predetermined electrical charge having a first value;
      a second capacitor, the second capacitor comprising a second set of capacitor plates with dielectric between the plates, the second capacitor being capable of storing a predetermined electrical charge having a second value;
      a third capacitor, the third capacitor comprising a third set of capacitor plates with dielectric between the plates, the third capacitor being capable of storing a predetermined electrical charge having a second value;
      a fourth capacitor, the fourth capacitor comprising a fourth set of capacitor plates with dielectric between the plates, the fourth capacitor being capable of storing a predetermined electrical charge having a first value; and
      first, second, third and fourth respective pairs of terminations provided at opposing peripheral sides of the capacitor array, wherein each pair of terminations provides respective electrical connection to selected of the first, second, third and fourth respective sets of capacitor plates such that each first, second, third and fourth capacitor is respectively configured for distinct circuit connection thereto;
   wherein the first and fourth capacitors each exhibit a first value, and the second and third capacitors each exhibit a second value, the first value and second value differing from each other by at least a factor of about 2:1; and
   further wherein said capacitor array is encased in a dielectric.

39. A capacitor array of parallel capacitors arranged in a single manufactured unit, comprising:

a first capacitor, the first capacitor comprising a first set of capacitor plates, the first capacitor being capable of storing a predetermined electrical charge having a first value;

a first pair of terminations provided at opposing peripheral sides of the single manufactured unit, wherein said first pair of terminations provides respective electrical connection to selected of the first set of capacitor plates such that said first capacitor is configured for distinct circuit connection thereto;

a second capacitor, the second capacitor comprising a second set of capacitor plates, the second capacitor being capable of storing a predetermined electrical charge having a second value, wherein the first value and the second value are not the same, such that the capacitor array comprises at least two capacitors that differ in capacitance value; and a second pair of terminations provided at opposing peripheral sides of the single manufactured unit, wherein said second pair of terminations provides respective electrical connection to selected of the second set of capacitor plates such that said second capacitor is configured for distinct circuit connection thereto.

40. The capacitor array of claim 39, wherein the capacitor plates of the first capacitor and the capacitor plates of the second capacitor are formed by combining alternating layers of dielectric and conductive materials.

41. The capacitor array of claim 39, additionally comprising:

a third capacitor, the third capacitor comprising a third set of capacitor plates, the third capacitor being capable of storing a predetermined electrical charge having a third value; and a third pair of terminations provided at opposing peripheral sides of the single manufactured unit, wherein said third pair of terminations provides respective electrical connection to selected of the third set of capacitor plates such that said third capacitor is configured for distinct circuit connection thereto.

42. The capacitor array of claim 41, additionally comprising:

a fourth capacitor, the fourth capacitor comprising a fourth set of capacitor plates, the fourth capacitor being capable of storing a predetermined electrical charge having a fourth value; and a fourth pair of terminations provided at opposing peripheral sides of the single manufactured unit, wherein said fourth pair of terminations provides respective electrical connection to selected of the fourth set of capacitor plates such that said fourth capacitor is configured for distinct circuit connection thereto.

43. The capacitor array of claim 42, wherein the second and third capacitors are located on the array between the first and fourth capacitors, further wherein the first value of the first capacitor and the fourth value of the fourth capacitor are about the same.

44. The capacitor array of claim 43, wherein the second value and the third value are about the same.

* * * * *

UNITED STATES PATENT AND TRADEMARK OFFICE
CERTIFICATE OF CORRECTION

PATENT NO. : 6,515,842 B1
DATED : February 4, 2003
INVENTOR(S) : Wilson Hayworth et al.

It is certified that error appears in the above-identified patent and that said Letters Patent is hereby corrected as shown below:

Column 14,
Line 29, please delete "splates" and replace with -- plates --.

Column 15,
Lines 5, 7, 13, and 15, please delete "comprise" and replace with -- comprises --.

Signed and Sealed this

Sixth Day of September, 2005

JON W. DUDAS
*Director of the United States Patent and Trademark Office*